US 8,514,535 B2

(12) United States Patent
Gauthier, Jr. et al.

(10) Patent No.: US 8,514,535 B2
(45) Date of Patent: Aug. 20, 2013

(54) ELECTROSTATIC DISCHARGE DEVICE CONTROL AND STRUCTURE

(75) Inventors: Robert J. Gauthier, Jr., Hinesburg, VT (US); Junjun Li, Williston, VT (US); Souvick Mitra, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 227 days.

(21) Appl. No.: 12/987,276

(22) Filed: Jan. 10, 2011

(65) Prior Publication Data

US 2012/0176721 A1 Jul. 12, 2012

(51) Int. Cl.
*H02H 3/22* (2006.01)

(52) U.S. Cl.
USPC .............................................. 361/56; 361/111

(58) Field of Classification Search
USPC .................................... 361/56, 111
See application file for complete search history.

(56) References Cited

U.S. PATENT DOCUMENTS

| | | | |
|---|---|---|---|
| 5,982,217 A | 11/1999 | Chen et al. | |
| 6,169,312 B1 * | 1/2001 | Hiraga | 257/360 |
| 6,476,449 B1 | 11/2002 | Lin | |
| 6,611,407 B1 * | 8/2003 | Chang | 361/56 |
| 6,809,915 B2 * | 10/2004 | Lai et al. | 361/111 |
| 7,670,890 B2 | 3/2010 | El-Kareh et al. | |
| 7,671,416 B1 | 3/2010 | O et al. | |
| 2005/0045952 A1 | 3/2005 | Chatty et al. | |
| 2010/0181621 A1 | 7/2010 | Chang et al. | |

OTHER PUBLICATIONS

S. Mitra et al., "ESD Protection Using Grounded Gate, Gate Non-Silicided (GG-GNS) ESD NFETs in 45nm SOI Technology" EOS/ESD Symposium, 2008, pp. 312-316.
C. Russ, "ESD issues in advanced CMOS bulk and FinFET technologies: Processing, protection devices and circuit strategies" Microelectronics Reliability, 2008, pp. 1403-1411.
D. Tremouilles et al., "Understanding the Optimization of Sub-45nm FinFET Devices for ESD Applications" EOS/ESD Symposium, 2007, 8 pages.
R. Mishra et al., "ESD performance of 65 nm partially depleted n and p channel SOI MOSFETs" Solid-State Electronics, vol. 54, No. 4, Jan. 12, 2010, pp. 357-361.
K. Iniewski et al., "Design strategies for ESO protection in SOC" Proceedings of 4th IEEE International Workshop on System-on-Chip for Real-Time Applications, 2004, 5 pages.

* cited by examiner

*Primary Examiner* — Danny Nguyen
(74) *Attorney, Agent, or Firm* — Michael LeStrange; Roberts Mlotkowski Safran & Cole, P.C.

(57) ABSTRACT

Structures and methods for electrostatic discharge (ESD) device control in an integrated circuit are provided. An ESD protection structure includes an input/output (I/O) pad, and an ESD field effect transistor (FET) including a drain connected to the I/O pad, a source connected to ground, and a gate. A first control FET includes a drain connected to the I/O pad, a source connected to the gate of the ESD FET, and a gate connected to ground. A second control FET includes a drain connected to the gate of the ESD FET and the source of the first control FET, a source connected to ground, and a gate connected to the I/O pad.

21 Claims, 3 Drawing Sheets

US 8,514,535 B2

ELECTROSTATIC DISCHARGE DEVICE CONTROL AND STRUCTURE

FIELD OF THE INVENTION

The invention relates to integrated circuits and, more particularly, to structures and methods for electrostatic discharge (ESD) device control in an integrated circuit.

BACKGROUND

Integrated circuits may be damaged from discharges of static electricity, even at levels which can neither be seen nor felt. This is typically referred to as electrostatic discharge (ESD), where a transfer of an electrostatic charge occurs between bodies at different electrostatic voltage potentials caused by direct contact or induced by an electrostatic field. Circuit failures due to ESD are not always immediately catastrophic, but often a circuit is weakened, is less able to withstand normal operating stresses, and thus, may result in a reliability problem.

Various ESD protection circuits have been included in integrated circuits to protect various components, with an assortment of considerations necessary for such ESD protection circuits. For example, ESD protection is necessary for all pins going to the outside world. However, some ESD protection circuits are not robust since they, for instance, cannot handle ESD's of negative voltage potentials. In addition, other ESD protection circuits require large areas of integrated circuits, resulting in less capacity for functional paths in integrated circuits.

Accordingly, there exists a need in the art to overcome the deficiencies and limitations described hereinabove.

SUMMARY

In a first aspect of the invention, an electrostatic discharge (ESD) protection structure includes an input/output (I/O) pad, and an ESD field effect transistor (FET) including a drain connected to the I/O pad, a source connected to ground, and a gate. A first control FET includes a drain connected to the I/O pad, a source connected to the gate of the ESD FET, and a gate connected to ground. A second control FET includes a drain connected to the gate of the ESD FET and the source of the first control FET, a source connected to ground, and a gate connected to the I/O pad.

In another aspect of the invention, an ESD protection structure includes an input/output (I/O) pad, and an ESD field effect transistor (FET) including a drain connected to the I/O pad, a source connected to ground, and a gate. A first control FET includes a drain connected to the I/O pad, a source connected to the gate of the ESD FET, and a gate connected to ground. A second control FET includes a drain connected to the gate of the ESD FET and the source of the first control FET, a source connected to ground, and a gate connected to the I/O pad. The first control FET biases the gate of the ESD FET with a positive ESD voltage when the I/O pad receives the positive ESD voltage, to turn on the ESD FET. The first control FET reverse biases the gate of the ESD FET with a negative ESD voltage when the I/O pad receives the negative ESD voltage, to turn off the ESD FET. The drain and the source of the ESD FET are silicide-blocked. Each of a gate dielectric of the first control FET and a gate dielectric of the second control FET is thicker than a gate dielectric of the ESD FET.

In yet another aspect of the invention, a method of controlling electrostatic discharge (ESD) protection, comprising receiving an ESD voltage. The method also includes biasing an ESD field effect transistor (FET) with the ESD voltage to turn on the ESD FET when the ESD voltage is positive and to turn off the ESD FET when the ESD voltage is negative.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to integrated circuits and, more particularly, to structures and methods for electrostatic discharge (ESD) device control in an integrated circuit. More specifically, the invention provides various control circuits that can bias a gate of an ESD protection device, e.g., a nMOS field effect transistor (NFET). This leads to a symmetric operation of the ESD protection device under ESD's of positive and negative voltage potentials. Advantageously, the structure of the present invention handles higher values of ESD currents, compared to conventional devices, while protecting the ESD protection device from negative voltage potentials that it cannot completely handle.

Figure 1:
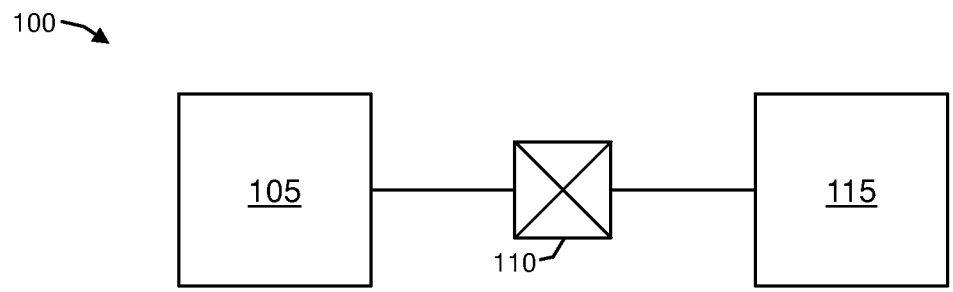
FIG. 1 shows an exemplary electrostatic discharge (ESD) protection scheme.

FIG. 1 shows an exemplary ESD protection scheme 100 including a circuit 105, an input/output (I/O) pad 110, and an ESD protection circuit 115. In embodiments, the circuit 105, the I/O pad 110, and the ESD protection circuit 115 are electrically connected in series. In embodiments, the circuit 105 receives input voltages from other circuits through the I/O pad 110, and sends output voltages to other circuits through the I/O pad 110. In embodiments, the circuit 105 may include at least one of various semiconductor devices known in the art, such as a NFET driver and/or an inverter.

In operation, the ESD protection circuit 115 protects the circuit 105 during an ESD event at the I/O pad 110. Specifically, during the ESD event, the ESD protection circuit 115 receives an ESD voltage from the I/O pad 110, so the circuit 105 does not receive the ESD voltage and be damaged by such a voltage. In embodiments, the ESD protection circuit 115 may include at least one semiconductor device ("an ESD protection device"), such as a NFET. The ESD protection circuit 115 may also include a control circuit connected to the ESD protection device to, for example, bias a gate of the ESD protection device, as discussed herein.

Figure 2:
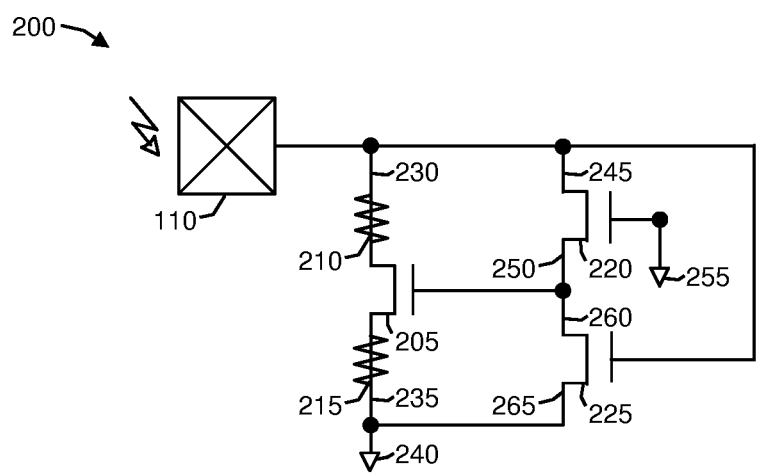
FIG. 2 shows an exemplary structure for ESD device control in accordance with aspects of the invention.

FIG. 2 shows an exemplary structure 200 for ESD device control in accordance with aspects of the invention. The structure 200 includes the I/O pad 110 of FIG. 1 that receives the input and ESD voltages. The structure 200 also includes an ESD NFET 205 connected in series to the I/O pad 110. The ESD NFET 205 serves as an ESD protection device. A drain 230 of the ESD NFET 205 is coupled to the I/O pad 110, and a source 235 of the ESD NFET 205 is coupled to ground 240. The ESD NFET 205 includes series resistances 210, 215 built inside the ESD NFET 205, and may be silicide-blocked (e.g., the drain 230, the source 235, and a gate of the ESD NFET 205 may be covered by a nitride mask), to create the series resistances 210, 215 in the ESD NFET 205.

The structure 200 further includes a first control NFET 220 and a second control NFET 225, connected in parallel to the ESD NFET 205. The first control NFET 220 and the second control NFET 225 are connected in series. A drain 245 of the first control NFET 220 is coupled to the I/O pad 110 and may receive the ESD voltage from the I/O pad 110. A source 250 of the first control NFET 220 is coupled to a drain 260 of the second control NFET 225, and a source 265 of the second control NFET 225 is coupled to ground 240. A gate of the first control NFET 220 is coupled to ground 255, while a gate of the second control NFET 225 is coupled to the I/O pad 110.

The source 250 of the first control NFET 220 and the drain 260 of the second control NFET 225 are connected to a gate of the ESD NFET 205. As the gate of the first control NFET 220 is coupled to ground 255, a conductive channel of the first control NFET 220 is created or maintained, and the ESD voltage may drop from the drain 245 to the source 250 of the first control NFET 220. In other words, the first control NFET 220 is turned on, and an ESD current may flow through the conductive channel of the first control NFET 220. The gate of the ESD NFET 205 may then be biased with the ESD voltage. The ESD voltage may also drop from the drain 260 to the source 265 of the second control NFET 225, e.g., the ESD current may flow through a conductive channel of the second control NFET 225.

In embodiments, the first and the second control NFET's 220, 225 may include a gate dielectric comprising a thick oxide, to protect the control NFET's 220, 225 from damage due to the dropped ESD voltage. In particular, the oxide of the first and the second control NFET's 220, 225 may be thicker than an oxide of the ESD NFET 205. For example, the oxide may include a thickness of about 12-18 Ångströms (Å), in control NFET's designed to receive ESD voltages of about 1 volt (V). In another example, the oxide may include a thickness of about 20-52 Å, in control NFET's designed to receive ESD voltages of about 3-5 V.

In operation, the gate of the ESD NFET 205 is biased differently based on whether the I/O pad 110 receives a positive ESD voltage or a negative ESD voltage. When the I/O pad 110 receives the positive ESD voltage, the positive ESD voltage drops from the drain 245 to the source 250 of the first control NFET 220, and the positive ESD voltage biases the gate of the ESD NFET 205. This creates or maintains a conductive channel of the ESD NFET 205 that allows the positive ESD voltage to drop from the drain 230 to the source 235 of the ESD NFET 205, to ground 240. The positive ESD voltage is also received by the gate of the second control NFET 225, creating or maintaining a conductive channel of the second control NFET 225. Accordingly, the positive ESD voltage drops from the drain 260 to the source 265 of the second control NFET 225 and to ground 240.

Also, when the I/O pad 110 receives the negative ESD voltage, the negative ESD voltage drops from the drain 245 to the source 250 of the first control NFET 220, and the negative ESD voltage reverse biases the gate of the ESD NFET 205. That is, due to the negative ESD voltage at the gate of the ESD NFET 205, the ESD NFET 205 closes (e.g., turns off) the conductive channel of the ESD NFET 205. As such, the negative ESD voltage does not completely drop from the drain 230 to the source 235 of the ESD NFET 205, to ground 240, protecting the ESD NFET 205 from potential damage due to the negative ESD voltage. The negative ESD voltage is also received by the gate of the second control NFET 225, closing a conductive channel of the second control NFET 225. Accordingly, the negative ESD voltage does not completely drop from the drain 260 to the source 265 of the second control NFET 225 and to ground 240.

Advantageously, the invention provides a symmetric operation of the ESD protection device (e.g., the ESD NFET 205) under the positive and the negative ESD voltages using a small control circuit (e.g., the control NFET's 220, 225). This is compared to conventional systems that may use a larger semiconductor device, for instance, a diode. In addition, the control circuit may handle higher values of ESD voltages through the control NFET's including thick oxide. Moreover, the control circuit protects the ESD protection device from the negative ESD voltage by receiving most of the voltage and turning off the ESD protection device in the case of the negative ESD voltage.

Figure 3:
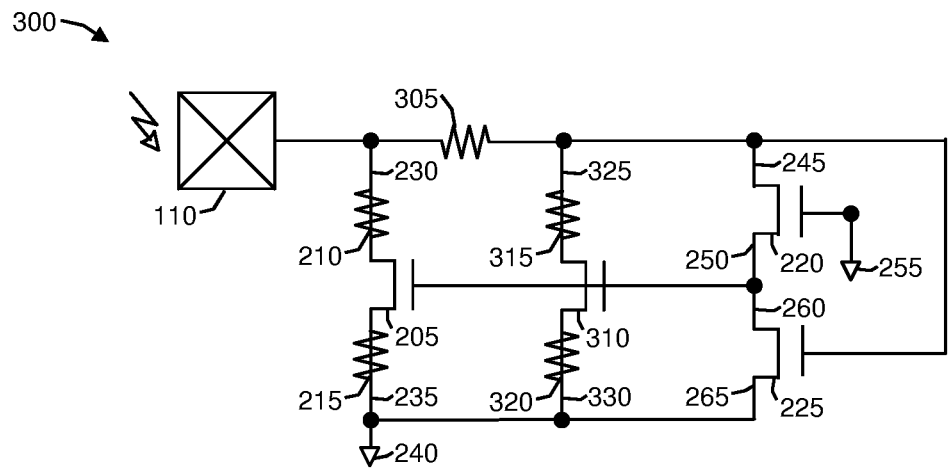
FIG. 3 shows another exemplary structure for ESD device control in accordance with aspects of the invention.

FIG. 3 shows another exemplary structure 300 for ESD device control in accordance with aspects of the invention. The structure 300 includes the I/O pad 110, the ESD NFET 205 including the series resistances 210, 215, and the first and the second control NFET's 220, 225, as discussed with respect to FIG. 2. The structure 300 further includes a secondary ESD NFET 310 including series resistances 315, 320 built inside the secondary ESD NFET 310. A Charged Device Model (CDM) resistor 305 is coupled to the I/O pad 110 and the drain 230 of ESD NFET 205 at one end, and coupled to a drain 325 of the secondary ESD NFET 310 at another end. The drain 325 of the secondary ESD NFET 310 is coupled to the drain 245 of the first control NFET 220, while the source 330 of the secondary ESD NFET 310 is coupled to ground 240. The source 250 of the first control NFET 220 and the drain 260 of the second control NFET 220 are coupled to the gate of the secondary ESD NFET 310, to bias the gate of the secondary ESD NFET 310.

The secondary ESD NFET 310 provides secondary protection for a circuit connected to the structure 300. For example, the ESD NFET 310 can protect the circuit 105 in FIG. 1 from its own electrostatic charges and discharges. More specifically, the secondary ESD NFET 310 provides protection for the ESD NFET 205 from receiving too much ESD current during ESD events, including those involving a circuit's own electrostatic charges and discharges. A CDM simulation test is used to define an amount of ESD current that a circuit can withstand due to its own electrostatic charges and discharges. For example, this CDM-defined amount of ESD current depends on an amount of charge that can accumulate on a surface of the circuit, and thus, on a surface size of the circuit. Based on the amount of ESD current the circuit and the ESD NFET 205 can withstand, the CDM resistor 305 and the secondary ESD NFET 310 may be designed or configured accordingly.

In accordance with the invention, when the I/O pad 110 receives a positive ESD voltage, the CDM resistor 305 reduces the ESD current into two portions. A larger portion of the ESD current flows through the ESD NFET 205, and a smaller portion of the ESD current flows through the secondary ESD NFET 310, to ground 240. Accordingly, the ESD NFET 205 is protected from the entire ESD current, which may include a larger amount than the gate of the ESD NFET 205 is designed to receive. In addition, the smaller amount of the ESD current flows through the first control NFET 220, and therefore, a smaller amount of the positive ESD voltage biases the gates of the ESD NFET 205 and the secondary ESD NFET 310. Also, when the I/O pad 110 receives a negative ESD voltage, the ESD current flows through the first control NFET 220, and the negative ESD voltage reverse biases the gates of the ESD NFET 205 and the secondary ESD NFET 310, to turn off the ESD NFET 205 and the secondary ESD NFET 310.

Figure 4:
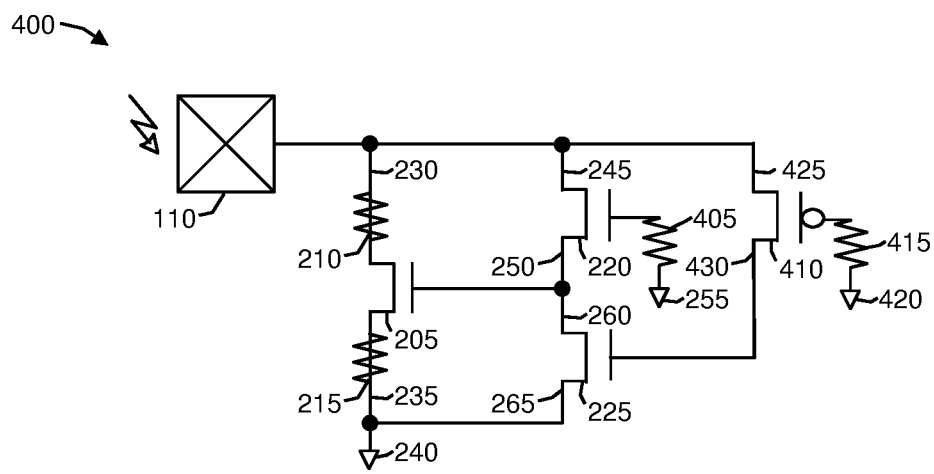
FIG. 4 shows yet another exemplary structure for ESD device control in accordance with aspects of the invention.

FIG. 4 shows yet another exemplary structure 400 for ESD device control in accordance with aspects of the invention. The structure 400 includes the I/O pad 110, the ESD NFET 205 including the series resistances 210, 215, and the first and the second control NFET's 220, 225, as discussed with respect to FIG. 2. The structure 400 also includes a resistor 405 connected in series between the gate of the first control NFET 220 and ground 255. The structure 400 also includes a control pMOS FET (PFET) 410 with a resistor 415 connected in series between a gate of the control PFET 410 and ground 420. In this embodiment, the resistor 415 adjusts a voltage applied to the gate of the control PFET 410. A source 425 of the control PFET 410 is coupled to the I/O pad 110 (and the drain 245 of the first control NFET 220), and a drain 430 of the control PFET 410 is coupled to the gate of the second control NFET 225.

Compared to the structure 200 of FIG. 2 in which the gate of the first control NFET 220 is coupled hard to ground 255 such that the first control NFET 220 is always turned on, in FIG. 4, the gate of the first control NFET 220 is coupled to ground 255 through the resistor 405. The resistor 405 adjusts a voltage applied to the gate of the first control NFET 220. In this way, the turning on of the first control NFET 220 and the subsequent gate biasing of the ESD NFET 205 are delayed for a predetermined period of time based on a resistance value of the resistor 405. Also, instead of the second control NFET 225 receiving the ESD voltage directly from the I/O pad 110, the second control NFET 225 receives the ESD voltage from the control PFET 410. Further, the resistor 415 adjusts a voltage applied to the gate of the control PFET 410. In this way, a creation or maintenance of a conductive channel of the control PFET 410 and the subsequent gate biasing of the second control NFET 225 are delayed for a predetermined period of time based on a resistance value of the resistor 415.

Figure 5:
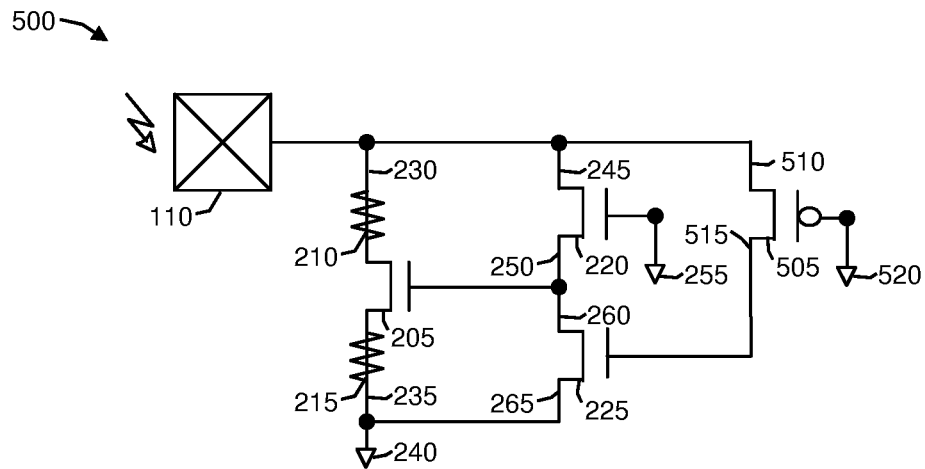
FIG. 5 shows still another exemplary structure for ESD device control in accordance with aspects of the invention.

FIG. 5 shows still another exemplary structure 500 for ESD device control in accordance with aspects of the invention. The structure 500 includes the I/O pad 110, the ESD NFET 205 including the series resistances 210, 215, and the first and the second control NFET's 220, 225, as discussed with respect to FIG. 2. The structure 500 also includes a control PFET 505 with a gate coupled to ground 520. A source 510 of the control PFET 505 is coupled to the I/O pad 110 (and the drain 245 of the first control NFET 220), and a drain 515 of the control PFET 505 is coupled to the gate of the second control NFET 225. Compared to the structure 400 of FIG. 4, the gates of the first control NFET 220 and the control PFET 505 are not connected to resistors. Instead, the gates of the first control NFET 220 and the control PFET 505 are each connected directly to ground 255, 520, respectively. In operation, the ESD voltage drops from the source 510 to the drain 515 of the control PFET 505, e.g., the ESD current may flow through a conductive channel of the control PFET 505. In this implementation, the control PFET 505 may be used to adjust (e.g., decrease) an amount of the ESD voltage that is received at the gate of the second control NFET 225, to protect the gate of the second control NFET 225 from damage to ESD voltages.

In embodiments, the control PFET 505 may include a gate dielectric comprising a thick oxide, to protect the control PFET 505 from damage due to the dropped ESD voltage. In particular, the oxide of the control PFET 505 may be thicker than an oxide of the ESD NFET 205. For example, the oxide may include a thickness of about 12-18 Å, when the control PFET 505 is designed to receive ESD voltages of about 1 V. In another example, the oxide may include a thickness of about 20-52 Å, when the control PFET 505 is designed to receive ESD voltages of about 3-5 V.

Figure 6:
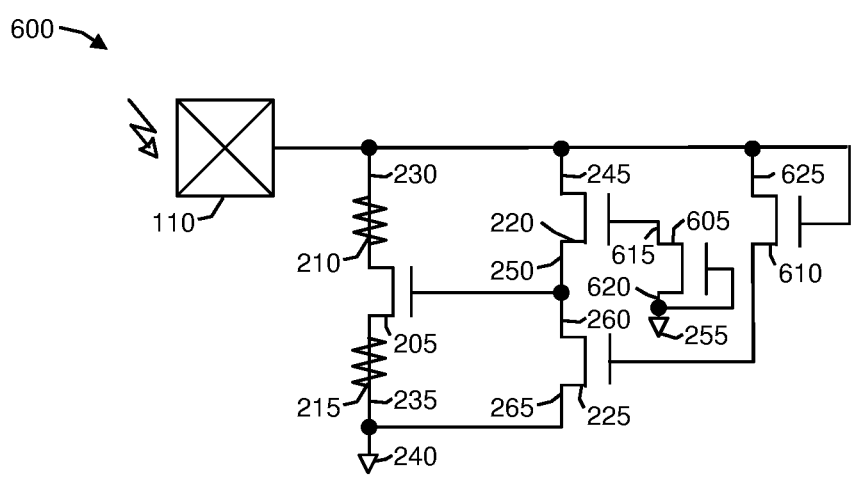
FIG. 6 shows a further exemplary structure for ESD device control in accordance with aspects of the invention.

FIG. 6 shows a further exemplary structure 600 for ESD device control in accordance with aspects of the invention. The structure 600 includes the I/O pad 110, the ESD NFET 205 including the series resistances 210, 215, and the first and the second control NFET's 220, 225, as discussed with respect to FIG. 2. The structure 600 also includes a third control NFET 605 that is connected in series between the gate of the first control NFET 220 and ground 255, and a fourth control NFET 610 that is connected between the drain 245 of the first control NFET 220 and the gate of the second control NFET 225. The I/O pad 110 is coupled to a drain 625 of the fourth control NFET 610 and the gate of the fourth control NFET 610.

In operation, the NFET's 605, 610 break down the ESD current into two portions that flow through the first control NFET 220 and the fourth control NFET 610, respectively, to further protect the first control NFET 220 from damage due to ESD voltages. Specifically, in operation, the third control NFET 605 is always turned on since the gate of the third control NFET 605 is tied to ground 255. As the always-on third control NFET 605 is coupled to the gate of the first control NFET 220 and to ground 255, the first control NFET 220 is also always turned on, without having to be hard-grounded. Also, when the I/O pad 110 receives the positive ESD voltage, the gate of the fourth control NFET 610 receives the positive ESD voltage and turns or keeps on the fourth control NFET 610. The drain 625 of the fourth control NFET 610 then receives a portion of the ESD current, which is transferred to the gate of the second control NFET 225. In embodiments, each of the first control NFET 220, the second control NFET 225, the third control NFET 605, and the fourth control NFET 610 may have a thin gate dielectric comprising oxide.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. An electrostatic discharge (ESD) protection structure, comprising:
   an input/output (I/O) pad;
   an ESD field effect transistor (FET) comprising a drain connected to the I/O pad, a source connected to ground, and a gate;
   a first control FET comprising a drain connected to the I/O pad, a source connected to the gate of the ESD FET, and a gate connected to ground; and
   a second control FET comprising a drain connected to the gate of the ESD FET and the source of the first control FET, a source connected to ground, and a gate connected to the I/O pad.

2. The structure of claim 1, wherein the drain and the source of the ESD FET are silicide-blocked.

3. The structure of claim 1, wherein each of a gate dielectric of the first control FET and a gate dielectric of the second control FET is thicker than a gate dielectric of the ESD FET.

4. The structure of claim 3, wherein:
   each of the gate dielectric of the first control FET and the gate dielectric of the second control FET comprises an oxide thickness of about 12-18 Å; and
   each of the first control FET and the second control FET receives ESD voltages of about 1 volt.

5. The structure of claim 3, wherein:
   each of the gate dielectric of the first control FET and the gate dielectric of the second control FET comprises an oxide thickness of about 20-52 Å; and
   each of the first control FET and the second control FET receives ESD voltages of about 3-5 volts.

6. The structure of claim 1, wherein the first control FET biases the gate of the ESD FET with a positive ESD voltage when the I/O pad receives the positive ESD voltage, to turn on the ESD FET.

7. The structure of claim 1, wherein the first control FET reverse biases the gate of the ESD FET with a negative ESD voltage when the I/O pad receives the negative ESD voltage, to turn off the ESD FET.

8. The structure of claim 1, further comprising:
   a resistor connected to the I/O pad and the drain of the ESD FET; and
   a secondary ESD FET comprising a drain connected to the resistor in series and the drain of the first control FET, a source connected to ground, and a gate connected to the source of the first control FET and the drain of the second control FET.

9. The structure of claim 1, further comprising:
   a first resistor connected in series between the gate of the first control FET and ground;
   a control FET connected between the drain of the first control FET and the gate of the second control FET; and
   a second resistor connected in series between the gate of the control FET and ground.

10. The structure of claim 1, further comprising a control FET connected between the drain of the first control FET and the gate of the second control FET, a gate of the control PFET connected to ground.

11. The structure of claim 1, further comprising:
    a third control FET connected in series between the gate of the first control FET and ground; and
    a fourth control FET connected between the drain of the first control FET and the gate of the second control FET, the I/O pad connected to a gate of the fourth control FET.

12. An electrostatic discharge (ESD) protection structure, comprising:
    an input/output (I/O) pad;
    an ESD field effect transistor (FET) comprising a drain connected to the I/O pad, a source connected to ground, and a gate;
    a first control FET comprising a drain connected to the I/O pad, a source connected to the gate of the ESD FET, and a gate connected to ground; and
    a second control FET comprising a drain connected to the gate of the ESD FET and the source of the first control FET, a source connected to ground, and a gate connected to the I/O pad, wherein
    the first control FET biases the gate of the ESD FET with a positive ESD voltage when the I/O pad receives the positive ESD voltage, to turn on the ESD FET,
    the first control FET reverse biases the gate of the ESD FET with a negative ESD voltage when the I/O pad receives the negative ESD voltage, to turn off the ESD FET,
    the drain and the source of the ESD FET are silicide-blocked, and
    each of a gate dielectric of the first control FET and a gate dielectric of the second control FET is thicker than a gate dielectric of the ESD FET.

13. The structure of claim 12, wherein:
    each of a gate dielectric of the first control FET and a gate dielectric of the second control FET comprises an oxide thickness of about 12-18 Å; and
    each of the first control FET and the second control FET receives ESD voltages of about 1 volt.

14. The structure of claim 12, wherein:
    each of a gate dielectric of the first control FET and a gate dielectric of the second control FET comprises an oxide thickness of about 20-52 Å; and
    each of the first control FET and the second control FET receives ESD voltages of about 3-5 volts.

15. The structure of claim 12, further comprising:
    a resistor connected to the I/O pad and the drain of the ESD FET; and
    a secondary ESD FET comprising a drain connected to the resistor in series and the drain of the first control FET, a source connected to ground, and a gate connected to the source of the first control FET and the drain of the second control FET.

16. The structure of claim 12, further comprising:
    a first resistor connected in series between the gate of the first control FET and ground;
    a control FET connected between the drain of the first control FET and the gate of the second control FET; and
    a second resistor connected in series between the gate of the control FET and ground.

17. The structure of claim 12, further comprising a control FET connected between the drain of the first control FET and the gate of the second control FET, a gate of the control PFET connected to ground.

18. The structure of claim 12, further comprising:
    a third control FET connected in series between the gate of the first control FET and ground; and
    a fourth control FET connected between the drain of the first control FET and the gate of the second control FET, the I/O pad connected to a gate of the fourth control FET.

19. A method of controlling electrostatic discharge (ESD) protection, comprising:
    receiving an ESD voltage;
    when the ESD voltage is positive:
      receiving the positive ESD voltage from an I/O pad at a drain of a first control field effect transistor (FET);

dropping the positive ESD voltage from the drain of the first control FET to a source of the first control FET: and biasing a gate of an ESD FET with the positive ESD voltage to turn on the ESD FET, wherein the source of the first control FET is connected to the gate of the ESD FET; and when the ESD voltage is negative;

receiving the negative ESD voltage from the I/O pad at the drain of the first control FET;

dropping the negative ESD voltage from the drain of the first control FET to the source of the first control FET: and reverse biasing the ESD FET with the negative ESD voltage to turn off the ESD FET.

20. The method of claim 19, further comprising delaying the biasing of the ESD FET with the ESD voltage for a predetermined period of time.

21. The method of claim 19, wherein:

when the ESD voltage is positive:

receiving the positive ESD voltage from the I/O pad at a gate of a second control FET; and dropping the positive ESD voltage from a drain of the second control FET to a source of the second control FET and to a ground;

when the ESD voltage is negative:

receiving the negative ESD voltage from the I/O pad at the gate of the second control FET; and closing a conductive channel of the second control FET; and the drain of the second control FET is connected to the gate of the ESD FET.

* * * * *